United States Patent [19]

Khanna et al.

[11] Patent Number: 5,221,592
[45] Date of Patent: Jun. 22, 1993

[54] DIAZO ESTER OF A BENZOLACTONE RING COMPOUND AND POSITIVE PHOTORESIST COMPOSITION AND ELEMENT UTILIZING THE DIAZO ESTER

[75] Inventors: Dinesh N. Khanna; Douglas McKenzie, both of Greenwich; Chester J. Sobodacha; Ralph R. Dammel, both of Coventry, all of R.I.

[73] Assignee: Hoechst Celanese Corporation, Somerville, N.J.

[21] Appl. No.: 847,527

[22] Filed: Mar. 6, 1992

[51] Int. Cl.$^5$ .................... G03F 7/023; G03F 7/09; G03C 1/61
[52] U.S. Cl. .................... 430/165; 430/191; 430/192; 430/193; 430/272; 430/275; 430/277; 430/278; 534/557
[58] Field of Search ............ 430/190, 191, 192, 193, 430/165, 272, 277, 278, 275; 534/556, 557, 560, 561, 563, 564, 565

[56] References Cited

U.S. PATENT DOCUMENTS

| | | |
|---|---|---|
| 4,701,399 | 10/1987 | Nagano et al. .................... 430/191 |
| 4,721,665 | 1/1988 | Dooley et al. .................... 430/192 |
| 4,772,534 | 9/1988 | Kawamura et al. .................... 430/191 |
| 4,818,658 | 4/1989 | Martin et al. .................... 430/191 |
| 4,985,333 | 1/1991 | Tokutake et al. .................... 430/191 |
| 5,064,741 | 11/1991 | Koike et al. .................... 430/191 |
| 5,116,715 | 5/1992 | Roland et al. .................... 430/191 |

*Primary Examiner*—Charles L. Bowers, Jr.
*Assistant Examiner*—Christopher G. Young
*Attorney, Agent, or Firm*—Andrew F. Sayko, Jr.

[57] ABSTRACT

A photosensitizer comprising a diazo ester of benzolactone ring compound, such as phenolphthalein or cresolphthalein as the backbone, where at least one of the hydroxy groups on the benzolactone ring compound has been esterified with diazo-sulfonyl chloride consisting of 60 to 100 mole % 2,1,4 or 2,1,5-diazo sulfonyl chloride or a mixture thereof, and a photoresist comprising an admixture of the photosensitizer, which is present in the photoresist composition in an amount sufficient to uniformly photosensitize the photoresist composition; a water insoluble, aqueous alkali soluble novolak resin, the novolak resin being present in the photoresist composition in an amount sufficient to form a substantially uniform photoresist composition and a suitable solvent.

12 Claims, No Drawings

DIAZO ESTER OF A BENZOLACTONE RING COMPOUND AND POSITIVE PHOTORESIST COMPOSITION AND ELEMENT UTILIZING THE DIAZO ESTER

FIELD OF THE INVENTION

The present invention relates to positive photoresist compositions especially sensitive in the broad band range of the spectrum (365–436 nm), based on a diazonaphthoquinone sensitizer using a benzolactone ring as the backbone, a novolak resin and a solvent.

DESCRIPTION OF RELATED ART

Photoresists are materials which change their solubility in a developer solution after the photoresist has been exposed to actinic radiation, such as to ultra violet radiation. Photoresist compositions comprise a photosensitive compound (sometimes called a photosensitizer), a film forming polymeric resin and a solvent. There are other types of compositions possible, such as a photosensitizer composition dissolved in an appropriate solvent. The photoresist composition is applied to a substrate which is to be patterned and the solvent is then removed, as with heat, leaving the photoresist as a thin film covering the substrate. As a consequence of the exposure to radiation of the photoresist, a different solubility rate results between the exposed and unexposed (masked over) portions of the resist film which yields a surface relief pattern after development. Those photoresists which become more soluble in a developer solution in the exposed regions are referred to as "positive" photoresists. Those which become less soluble in the exposed regions are referred to as "negative" photoresists. The present invention deals with a class of those compounds suitable for use in positive photoresist compositions.

Positive photoresists may comprise an aqueous alkali soluble resin, such as a novolak resin or a poly(p-hydroxystyrene), and a photosensitizer. The resin and sensitizer are applied, such as by spin coating, spray coating, or other suitable means, from an organic solvent or solvent mixture onto a substrate, such as a silicon wafer or a chrome-plated glass plate. The developer used to process the positive photoresists are aqueous alkaline solutions, such as sodium metasilicate, potassium hydroxide, tetramethyl ammonium hydroxide and ammonium hydroxide. The developer removes the areas of the coated photoresist film that have been exposed to light or other form of irradiation so as to produce a relief pattern in the photoresist film.

The application of a photosensitive film to various substrates is an essential step in the fabrication of integrated circuits. The substrates are generally silicon wafers which may have a thin oxide coating or other coating such as silicon nitride or aluminum. The photosensitive film is used to pattern the substrate in a series of steps including exposure (through a mask pattern), development to yield a relief pattern in the resist layer and a substrate etch step to transfer that pattern into the substrate material. It is essential that the mask pattern be accurately reproduced in the substrate etch pattern. To achieve this high degree of accuracy, the mask pattern must be well resolved by the photoresist layer. Conventional photoresists may employ novolak resins as the alkali soluble, film forming polymer.

BACKGROUND OF THE INVENTION

The present invention relates to radiation sensitive positive working photoresist compositions and particularly to compositions containing novolak resins together with a photosensitizer which is a diazo sulfonyl diester produced by reacting 2,1,4 or 2,1,5 diazo sulfonyl chloride with a benzolactone containing backbone, such as phenolphthalein or cresolphthalein.

It is known to the skilled artisan to produce positive photoresist compositions such as those described in U.S. Pat. Nos. 3,666,473; 4,115,128 and 4,173,470. These include water insoluble, aqueous alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The novolak resin component of these photoresist formulations is soluble in aqueous alkaline solutions, but the sensitizer is not soluble prior to exposure. Upon imagewise exposure of portions of the coated substrate to actinic radiation, the sensitizer is rendered alkali soluble and the exposed areas of the coating become more soluble than the unexposed areas. This difference in solubility rates causes the exposed areas of the photoresist coating to be dissolved when the substrate is immersed in or otherwise contacted with an alkaline developing solution, while the unexposed areas are largely unaffected, thus producing a positive relief pattern on the substrate. The exposed and developed substrate is usually thereafter subjected to an etching process. The photoresist coating protects the coated areas of the substrate from the etchant and the etchant is only able to etch the uncoated areas of the substrate, which correspond to the areas that were exposed to actinic radiation. Thus, an etched pattern can be created on the substrate which corresponds to the pattern of the mask, stencil, template, etc., that was used to created selective exposure patterns on the coated substrate prior to development. The relief pattern of photoresist on a substrate produced by this method is useful for various applications including the manufacture of miniaturized integrated circuits.

The characteristics of the photoresist compositions, which are important in commercial practice, include its photospeed, contrast, resolution (edge acuity), thermal stability of the image during processing, processing latitude, line width control, clean development and unexposed film loss.

Photoresist contrast is the slope of the linear portion of the curve resulting from the plot of the log of exposure energy vs. normalized film thickness remaining under fixed development conditions. In use, development of an exposed resist coated substrate is continued until the coating on the exposed area is substantially completely dissolved away. Resolution refers to the capability of a resist system to reproduce the smallest equally spaced line pairs and intervening spaces of a mask which is utilized during exposure with a high degree of image edge acuity in the developed exposed spaces. In the manufacture of miniaturized electronic components, a photoresist is required to provide a high degree of resolution for very small line and space widths usually on the order of one micron or less. This capability to reproduce very small dimensions, is extremely important in the production of large scale integrated circuits on silicon chips and similar components. Circuit density on such a chip can only be increased, assuming photolithography techniques are utilized, by increasing the resolution capabilities of the resist. Although negative photoresists, wherein the exposed areas of resist coating become insoluble and the unexposed areas are dissolved away by the developer, have been extensively used for this purpose by the semiconductor industry, positive photoresists have inherently higher resolution and are utilized as replacements for the negative resists.

In photoresist technology, it has normally been desired to increase resist contrast. High contrast positive working resists produce developed images which exhibit high edge acuity, when exposure is performed on typical equipment such as steppers and projection aligners. In most lithographic semiconductor applications, the high edge acuity of developed images is of great importance since it allows for small variations of line width over the wafer's topography. Therefore, it permits good control of etching during anisotropic plasma-etching and is typically associated with good processing latitude.

SUMMARY OF THE INVENTION

The invention provides a new photosensitizer and new positive photoresist compositions containing this photosensitizer. Such photoresist compositions have good photospeed, high contrast, good resolution, good thermal stability of the image during processing, wide processing latitude, good line width control, clean development and low unexposed film loss.

The photosensitive compound of the present invention comprises: a diazo sulfonyl ester of a benzolactone backbone, such as phenolphthalein or substituted phenolphthalein-like molecule (cresolphthalein), wherein the diazo ester is a compound wherein at least one hydroxy group on the benzolactone ring has been esterified with a sulfonyl chloride. On average, from about 60 mole percent to about 100 mole percent of the hydroxy groups of phenolphthalein type molecule have been esterified by the sulfonyl chloride. The diazo ester moiety is from about 60 to 100 mole percent of 2,1,4 diazo sulfonyl chloride/2,1,5 diazo sulfonyl chloride or a mixture thereof. Preferably the diazo ester distribution ranges from 75 to 100 mole percent and most preferably from about 85 to 95 mole percent.

The invention also provides a method for producing a positive photoresist composition, which provides an admixture of:

(a) a photosensitive component containing a diazo sulfonyl ester of a benzolactone backbone, such as phenolphthalein or substituted phenolphthalein-like molecule (cresolphthalein), wherein the diazo ester is a compound wherein at least one hydroxy agroup on the benzolactone ring has been esterified with a sulfonyl chloride. On average, from about 60 mole percent to about 100 mole percent of the hydroxy groups of phenolphthalein type molecule have been esterified by one sulfonyl chloride, the photosensitive component being present in the photoresist composition in an amount sufficient to uniformly photosensitize the photoresist composition; the diazo moiety ester is from 60 to about 100 mole percent 2,1,4 or 2,1,5 diazo ester or mixture thereof. Preferably the diazo ester distribution range from 75 to 100 mole percent and most preferably from about 85 to 95 mole percent;

(b) a water insoluble, aqueous alkali soluble novolak resin; the novolak resin being present in the photoresist composition in an amount sufficient to form a substantially uniform photoresist composition; and (c) a suitable solvent, preferably propylene glycol methyl ether acetate (PGMEA), ethyl lactate, ethyl 3-ethoxy propionate (EEP) or a mixture thereof. The positive photoresist composition comprises an admixture of:

(a) a photosensitive component containing a diazo sulfonyl ester of a benzolactone backbone, such as phenolphthalein or substituted phenolphthalein-like molecule (cresolphthalein) wherein the diazo ester is a compound wherein at least one hydroxy group on the benzolactone ring has been esterified with a sulfonyl chloride. On average, from about 60 mole percent to about 100 mole percent of the hydroxy groups of phenolphthalein type molecule have been esterified by the sulfonyl chloride The photosensitive component being present in the photoresist composition in an amount sufficient to uniformly photosensitize the photoresist composition; the diazo ester moiety is from about 60 to 100 mole percent of 2,1,4 diazo sulfonyl chloride/2,1,5 diazo sulfonyl chloride or a mixture thereof. Preferably the diazo ester distribution range from 75 to 100 mole percent and most preferably from about 85 to 95 mole percent;

(b) a water insoluble, aqueous alkali soluble novolak resin; the novolak resin being present in the photoresist composition in an amount sufficient to form a substantially uniform photoresist composition; and (c) a suitable solvent, preferably propylene glycol mono-methyl ether acetate (PGMEA), ethyl lactate, ethyl-3-ethoxy propionate (EEP) or a mixture thereof.

The invention further provides a photosensitive element which comprises the foregoing admixture coated and dried on a substrate.

The invention also provides a method for producing a photoresist image on a substrate, which comprises coating a substrate with a positive working photosensitive composition which composition contains in admixture (a) a photosensitive component containing a diazo sulfonyl ester of a benzolactone backbone, such as phenolphthalein or substituted phenolphthalein-like molecule (cresolphthalein), wherein the diazo ester is a compound wherein at least one hydroxy group on the benzolactone ring has been esterified with sulfonyl chloride. On average, from about 60 mole percent to about 100 mole percent of the hydroxy groups of phenolphthalein type molecule have been esterified by one sulfonyl chloride, the photosensitive component being present in the photoresist composition in an amount sufficient to uniformly photosensitize the photoresist composition; the diazo moiety ester is from 60 to about 100 mole percent 2,1,4 or 2,1,5 diazo ester or mixture thereof. Preferably the diazo ester distribution range from 75 to 100 mole percent and most preferably from about 85 to 95 mole percent;

(b) a water insoluble, aqueous alkali soluble novolak resin; the novolak resin being present in the photoresist composition in an amount sufficient to form a substantially uniform photoresist composition; and (c) a suitable solvent, preferably propylene glycol methyl ether acetate (PGMEA), ethyl lactate, ethyl 3-ethoxy propionate (EEP) or a mixture thereof. Heat treating said coated substrate until substantially all of the solvent composition is removed; imagewise exposing the photosensitive composition to actinic radiation; and removing the imagewise exposed areas of the composition with an aqueous alkaline developer. Optionally one may perform a baking of the substrate either immediately before or after the removing step.

DETAILED DESCRIPTION OF THE PREFERRED EMBODIMENT

In the production of the relief image of the present invention, one coats and dries the foregoing photoresist composition on a suitable substrate.

Novolak resins have been commonly used in the art of photoresist manufacture as exemplified by "Chemistry and Application of Phenolic Resins", Knop A. and Scheib, W.; Springer Verlag, New York, 1979 in Chapter 4. Similarly, o-quinone diazides are well known to the skilled artisan as demonstrated by "Light Sensitive System", Kosar, J.; John Wiley & Sons, New York, 1965 in Chapter 7.4.

The particular photosensitizer which is a component of the photoresist composition of the present invention is a diazo ester of benzolactone ring, such as phenolphthalein/cresolphthalein, having an the average from about 60 mole percent to 100 mole percent of its hydroxy groups esterified by diazo sulfonyl chloride, which is 2,1,4 diazo sulfonyl chloride or 2,1,5-sulfonyl chloride or a mixture thereof.

The photosensitizers utilized in the present invention may be characterized by the following structural formulas:

I. Phenolohthalein Backbone:

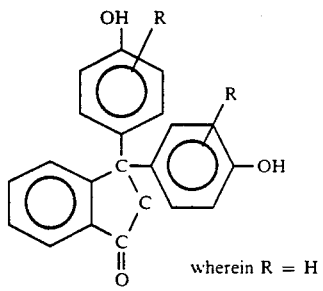

wherein R = H

II. Substituted Benzolactone Ring System

R (in II and III)=OH, $C_1$-$C_5$ Alkyl, $No_2$ or Halogen

III. Bis Benzolactone Ring Systems

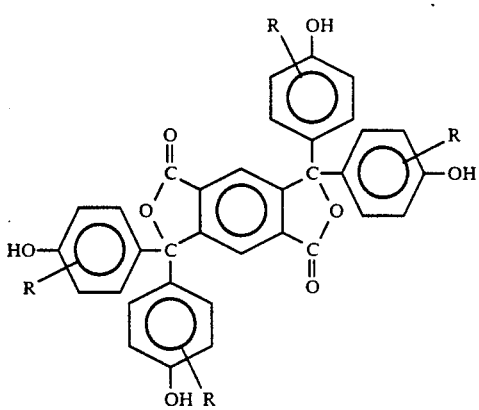

The photoresist composition is formed by blending the ingredients in a suitable solvent composition. In the preferred embodiment, the amount of novolak in the photoresist preferably ranges from 54% to about 99% and more preferably from about 70% to about 95% based on the weight of the solid, i.e. non-solvent resist parts. In the preferred embodiment, the sensitizer is present in the photoresist in an amount of from about 1% to about 35% or more preferably from about 5% to about 30% based on the weight of the solid resist parts. In manufacturing the resist composition the novolak and sensitizer are mixed with such solvents as acetone, chlorobenzene, propylene glycol mono-alkyl ether, propylene glycol alkyl ether acetates, ethyl lactate, butyl acetate, xylene, ethylene glycol monoethyl ether acetate, and most preferably propylene glycol monomethyl ether acetate (PGMEA), ethyl-3-ethoxypropionate (EEP) among others.

Other optional ingredients such as colorants, dyes, antistriation agents, leveling agents, plasticizers, adhesion promoters, speed enhancers, solvents and such surfactants as nonionic surfactants may be added to the solution of novolak resin, sensitizer and solvent before the solution is coated onto a substrate. Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to a five percent weight level, based on the combined weight of novolak and sensitizer. Plasticizers which may be used include, for example, phosphoric acid tri-(beta-chloroethyl)-ester; stearic acid; dicamphor; polypropylene; acetal resins; phenoxy resins; and alkyl resins at one to ten percent weight levels, based on the combined weight of novolak and sensitizer. The plasticizer additives improve the coating properties of the material and enable the application of a film that is smooth and of uniform thickness to the substrate. Adhesion promoters which may be used include, for example, beta-(3,4-epoxy-cyclohexyl)-ethyltrimethoxysilane; p-methyldisilane-methyl methacrylate; vinyltrichlorosilane; and gamma-aminopropyl triethoxysilane up to a 4 percent weight level, based on the combined weight of novolak and sensitizer. Development speed enhancers that may be used include, for example, picric acid, nicotinic acid or nitrocinnamic acid by a weight level of up to 20 percent, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

The coating solvents may be present in the overall composition in an amount of up to 95% by weight of the solids in the composition. Solvents, of course are substantially removed after coating of the photoresist solution on a substrate and drying. Non-ionic surfactants that may be used include, for example, nonylphenoxy poly(ethyleneoxy) ethanol; octylphenoxy ethanol at up to 10% weight levels, based on the combined weight of novolak and sensitizer.

The prepared resist solution, can be applied to a substrate by any conventional method used in the photoresist art, including dipping, spraying, whirling and spin coating. When spin coating, for example, the resist solution can be adjusted with respect to the percentage of solids content in order to provide coating of the desired thickness given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters. The substrate may have an adhesion promoted layer of a suitable composition such as one containing hexa-alkyl disilazane.

The resist composition solution is then coated onto the substrate, and the substrate is temperature treated at from about 80° C. to about 110° C. for from about 30 seconds to about 180 seconds on a hot plate or for from about 15 to about 40 minutes in a convection oven. This temperature treatment is selected in order to reduce the concentration of residual solvents in the photoresist while not causing substantial thermal degradation of the photosensitizer. In general one desires to minimize the concentration of solvents and thus this first temperature treatment is conducted until substantially all of the solvents have evaporated and a thin coating of photoresist composition, on the order of a micron in thickness, remains on the substrate. In a preferred embodiment the temperature is conducted at from about 85° C. to about 95° C. The treatment is conducted until the rate of change of solvent removal becomes relatively insignificant. The temperature and time selection depends on the resist properties desired by the user as well as equipment used and commercially desired coating times. The coating substrate can then be exposed to actinic radiation, especially ultraviolet radiation, at a wavelength of from about 300 nm to about 450 nm (preferably at about 365 nm), x-ray, electron beam, ion beam or laser radiation, in any desired pattern, produced by use of suitable masks, negatives, stencils, templates, etc.

The resist is then optionally subjected to a post exposure second baking or heat treatment either before or after development. The heating temperatures may range from about 90° C. to about 150° C., more preferably from about 110° C. to about 150° C. The heating may be conducted for from about 10 seconds to about 30 minutes, more preferably from about 45 seconds to about 90 seconds on a hot plate or about 10 to about 30 minutes by convection oven.

The exposed resist-coated substrates are developed to remove the imagewise exposed, non-image areas by spray developing using an alkaline developing solution. The solution is preferably agitated, for example, by nitrogen burst agitation. The substrates are allowed to remain in the developer until all, or substantially all, of the resist coating has dissolved from the exposed areas.

Developers may include aqueous solutions of ammonium or alkali metal hydroxides. One preferred hydroxide is tetramethyl ammonium hydroxide. A suitable developer is AZ Developer available commercially from the AZ Photoresist Products group of Hoechst Celanese Corporation, Somerville, New Jersey. After removal of the coated wafers from the developing solution, one may conduct an optional post-development heat treatment or bake in increase the coating's adhesion and chemical resistance to etching solutions and other substances. The post-development heat treatment can comprise the oven baking of the coating and substrate below the coating's softening point. The industrial applications, particularly in the manufacture of microcircuitry units on silicon/silicon dioxide-type substrates, the developed substrates may be treated with a buffered, hydrofluoric acid base etching solution. The resist compositions of the present invention are resistant to acid-base etching solutions and provide effective protection for the unexposed resist-coating areas of the substrate.

The following specific examples will provide detailed illustrations of the methods of producing and utilizing the compositions of the present invention. These examples are not intended to limit or restrict the scope of the invention in any way and should not be construed as providing conditions, parameters or values which must be utilized exclusively in order to practice the present invention.

EXAMPLE 1

Synthesis of 2,1,4-Diazo Ester of Phenolphthalein:

Into a 500 ml., four necked flask equipped with a thermometer, stirring shaft and dropping funnel are added 9.6 grams (0.03 moles) of phenolphthalein and 16.1 grams (0.06 moles) of 2,1,4-diazo sulfonyl chloride and 100 ml. of gamma- Butyrolactone. The mixture is stirred at room temperature (25° C.) for about 10 minutes to obtain a clear solution.

A separate solution of 7.1 grams (0.07 moles) of N-Methyl Morpholine is added into the reaction flask by dropping funnel over 10 minutes maintaining temperature at 20° C. The reaction mixture is stirred for 6 hours at room temperature. After the reaction is complete, 10 ml. of glacial acetic acid is added to destroy any unreacted sulfonyl chloride The reaction mixture is stirred for one hour and then filtered to remove salt and any impurities.

The reaction mixture is precipitated by drowning into mixture of 400 ml deionized water and 400 ml. of methanol. A yellow fine precipitate is obtained which is stirred for several hours then decanted, filtered and washed with about 5 liters of deionized water. The yellow cake is air dried first at room temperature by drawing air through a buchner funnel When the cake is air dried, it is placed in a vacuum oven at 40°-50° C. overnight. The yield of the product is 22 grams (95%) HPLC data indicates ester distribution to be: 92.24% 2,1,4-bisester and 7-8% other esters, and traces of unreacted starting materials.

EXAMPLE 2

Synthesis of 2,1,5-Diazo Ester of Phenolphthalein

Into a 500 ml., four necked flask equipped with a thermometer, stirring shaft and dropping funnel are added 15.6 grams (0.05 moles) of phenolphthalein and 26.9 grams (0.10 moles) of 2,1,5-diazo sulfonyl chloride and 150 ml. of gamma- Butyrolactone. The mixture is stirred at room temperature (25° C.) for about 10 minutes to obtain a clear solution.

A separate solution of 11.1 grams (0.11 moles) of N-Methyl Morpholine is added into the reaction flask by dropping funnel over 15 minutes maintaining temperature at 20° C. The reaction mixture is stirred for 6 hours at room temperature. The reaction mixture crashed out from the solution, indicating poor solubility of fully esterified 2,1,5-Diazo bis esters. After the reaction is complete, 10 ml. of glacial acetic acid is added to destroy any unreacted sulfonyl chloride. The reaction mixture is stirred for one hour and then filtered to remove salt and any impurities.

The reaction mixture is precipitated by drowning into mixture 400 ml. deionized water and 400 ml. of methanol. A yellow fine precipitate is obtained which is stirred for several hours then decanted, filtered and washed with about 5 liters of deionized water. The yellow cake is air dried first at room temperature by drawing air through a buchner funnel. When the cake is air dried, it is placed in a vacuum oven at 40°-50° C. overnight. The yield of the product is 32 grams (95%). HPLC data indicates ester distribution to be: 99.28% 2,1,5-bisester and −1 other esters and traces of unreacted starting materials.

EXAMPLE 3

Synthesis of 2,1,4-Diazo and 2,1,5-Diazo Mixed Esters of Phenolohthalein

Into a one liter, four flask equipped with a thermometer, stirring shaft and dropping funnel are added 19.1 grams (.06 moles) of phenolphthalein and 16.1 grams (0.06 moles) of 2,1,4-diazo sulfonyl chloride, 16.1 grams of 2,1,5-Diazo sulfonyl chloride and 250 ml. of gamma-Butyrolactone. The mixture is stirred at room temperature (25° C.) for about 20 minutes to obtain a clear solution.

A separate solution of 14.2 grams (0.14 moles) of N-Methyl Morpholine is added into the reaction flask by dropping funnel over 10 minutes maintaining temperature at 20° C. The reaction mixture is stirred for 6 hours at room temperature. After the reaction is complete, 10 ml. of glacial acetic acid is added to destroy any unreacted sulfonyl chloride. The reaction mixture is stirred for one hour and then filtered to remove salt and any impurities.

The reaction mixture is precipitated by drowning into mixture of 2 liters deionized water and 250 ml. of methanol. A yellow fine precipitate is obtained which is stirred for several hours then decanted, filtered and washed with about 17 liters of deionized water. The yellow cake is air dried first at room temperature by drawing air through a buchner funnel. When the cake is air dried, it is placed in a vacuum oven at 40°-50° C. overnight. The yield of the produce is 40.5 grams (95%). HPLC data indicates ester distribution to be: 2,1,4/2,1,5 (F/L) Bis Ester to be 47.47%; 2,1,5/2,1,5 (L/L) Bis Ester to be 21.52%; 2,1,4/2,1,4 (F/F) Bis Ester to be 27.36% and Unreacted 2,1,4-diazo Acid/Other Esters to be 3-4%.

EXAMPLE 4

Synthesis of 2,1,4-Diazo Ester of Cresolphthalein

Into a one liter, four necked flask equipped with a thermometer, stirring shaft and dropping funnel are added 20.8 grams 0.06 moles) of Cresolphthalein and 32.2 grams (0.12 of 2,1,4-diazo sulfonyl chloride and 250 ml. of gamma- Butyrolactone. The mixture is stirred at room temperature (25° C.) for about 10 minutes to obtain a clear solution.

A separate solution of 14.2 grams (1.4 moles) of N-Methyl Morpholine is added into the reaction flask by dropping funnel over 15 minutes maintaining temperature at 20° C. The reaction mixture is stirred for 6 hours at room temperature. After the reaction is complete, 10 ml. of glacial acetic acid is added to destroy any unreacted sulfonyl chloride. The reaction mixture is stirred for one hour and then filtered to remove salt and any impurities.

The reaction mixture is precipitated by drowning into mixture of 2200 ml. deionized water and 250 ml. of methanol. A yellow fine precipitate is obtained which is stirred for several hours then decanted, filtered and washed with about 21 liters of deionized water. The yellow cake is air dried first at room temperature by drawing air through a buchner funnel. When the cake is air dried, it is placed in a vacuum oven at 40°-50° C. overnight. The yield of the product is 47.2 grams (97.2%). HPLC data indicates ester distribution to be: 2,1,4-Diazo Bis Ester 87.76%; Mono Esters 8.46%; Other Esters 1-2%; and Unreacted Starting Materials <1.0%.

EXAMPLE 5

Lithographic Evaluation of 2,1,4-Diazo Ester of Phenolphthalein (from Example 1)

Four formulations of phenolphthalein diazo ester (PAC) are prepared by mixing with a m-cresol/3,5-xylenol Novolak resin (NR) using PGMEA solvent. The formulations were spin coated on silicon wafers to obtain 1-1.5 micron film thickness. The wafers are soft baked in an air oven for 30 minutes. All wafers are developed using 0.263n TMAH developer at 25+/−0.5° C. Following parameters are evaluated:

| Formulation | % PAC | RO | R | R/RO | Photospeed mj/cm$^2$ |
|---|---|---|---|---|---|
| #1 | 8.0 | 379 | 30850 | 82 | 112 |
| #2 | 12.0 | 23 | 61240 | 2650 | 112 |
| #3 | 16.0 | 5 | 90400 | 18100 | 162 |
| #4 | 23.0 | NONE | 123000 | — | 172 |
| REF. | 16.0 | 26 | 122500 | 4720 | 86 |

NR = Novolak Resin. Meta-Cresol/3,5-xylenol Condensate. 26% in PGMEA
RO = Dark Film Loss
R = Dissolution Rate of Fully Bleached Film
PAC = 2,1,4-Diazo Ester of Phenolphthalein
REF = 2,1,4-Diazo Ester of 2,3,4,4'-Tetra Hydroxy Benzophenone High R/RO values indicate greatest differential between exposed and unexposed film loss which affects photospeed and contrast. In comparison to conventional Diazo (Reference PAC) R/RO values are higher for phenolphthalein Diazo esters.

RESOLUTION: Using formulation #3, 0.5 micron line and space patterns were printed. The dose required to print 0.5 micron geometry using 1.0 micron thick film is about 200 mj/cm$^2$. The wall profile is nearly vertical and there is no scum at the surface of the film.

EXAMPLE 6

Lithographic Evaluation of 2,1,4-Diazo Ester of Cresolohthalein (From Example 4)

Formulation of cresolphthalein diazo ester (PAC) is prepared by mixing with a m-cresol/3,5-xylenol Novolak resin using PGMEA solvent. The formulation includes 5.17 grams of Novolak resin, 0.575 grams (10% of the total solid) of cresolphthalein diazo ester and 17.325 grams of PGMEA solvent. The formulations are spin coated at 2120 rpm/30 seconds and soft baked at 90° C./30 minutes to obtain 1.5 micron film thickness. All wafers are developed using 0.263N TMAH developer at 25+/−0.5° C. Following parameters are evaluated: R (Exposed Film Thickness)=39,700 A/min.; R0 (Unexposed Film Thickness =61 A/min.; R/R0=650; Photospeed=102 mj/cm$^2$; and Contrast=2.3.

RESOLUTION: Using 2,1,4-diazo ester of cresolphthalein and Novolak resin formations 0.5 micron line and space patterns are printed. The dose required to print 0.5 micron thick film is about 120 mj/cm$^2$. The wall profile is nearly vertical and there is no scum at the surface of the film.

What is claimed is:

1. A positive photoresist composition comprises an admixture of:
   (a) a photosensitizer comprising a diazo ester of a benzolactone ring compound; where the diazo ester is a compound wherein at least, one hydroxy group on the benzolactone ring compound has been esterified with diazo sulfonyl chloride consisting of 60 to 100 mole % 2,1,4 or 2,1,5 sulfonyl chloride or a mixture thereof; the photosensitizer being present in the photoresist composition in an amount sufficient to uniformly photosensitize the photoresist composition; and
   (b) a water insoluble, aqueous alkali soluble novolak resin, the novolak resin being present in the photoresist composition in an amount sufficient to form a substantially uniform photoresist composition.

2. The composition of claim 1 further comprising one or more solvents.

3. The composition of claim 2 wherein said solvent comprises propylene glycol monomethyl ether acetate.

4. The composition of claim 2 wherein said solvent comprises ethyl-3-ethoxypropionate.

5. The composition of claim 1 further comprising one or more additives selected from the group consisting of colorants, leveling agents, anti-striation agents, plasticizers, adhesion promoters, speed enhancers and surfactants.

6. The composition of claim 1 wherein (a) is present in an amount of from about 1 to about 35 weight percent and (b) is present in an amount from about 65 to about 95 weight percent, based on the non-solvent components of the composition.

7. A photosensitive element comprising a substrate and the dried composition of claim 1 coated on said substrate.

8. The element of claim 7 wherein the substrate is selected from the group consisting of silicon, aluminum, polymeric resins, silicon dioxide doped silicon dioxide, gallium arsenide, Group III/V compounds, silicon nitride, tantalum, copper, polysilicon, ceramics and aluminum/copper mixtures.

9. The element of claim 7 wherein the substrate has an adhesion promoted surface.

10. The element of claim 7 wherein the composition further comprises one or more components selected from the group consisting of non-aromatic colorants, dyes, anti-striation agents, leveling agents, plasticizers, adhesion promoters, speed enhancers and surfactants.

11. The element of claim 7 wherein (a) is present in an amount of from about 1 to 35 weight percent and (b) is present in an amount of from about 65 to 99 weight percent, based on the non-solvent components of the composition.

12. A photosensitizer comprising a diazo ester of a benzolactone ring compound where the diazo ester is a compound wherein at least one hydroxy group on the benzolactone ring compound has been esterified with diazo sulfonyl chloride consisting of 60 to 100 mole % 2,1,4 or 2,1,5 sulfonyl chloride or a mixture thereof.

* * * * *